(12) United States Patent
O'Daniel et al.

(10) Patent No.: US 7,388,894 B2
(45) Date of Patent: Jun. 17, 2008

(54) HYBRID MOPA HAVING NARROWBAND OSCILLATOR AND AMPLIFIER WITH INTEGRATED OPTICAL COUPLING

(75) Inventors: Jason Kirk O'Daniel, Winter Park, FL (US); Eric Gordan Johnson, Oviedo, FL (US); Oleg Smolski, Oviedo, FL (US); Pradeep Srinivasan, Oviedo, FL (US)

(73) Assignee: Eric G. Johnson, Harrisburg, NC (US)

( * ) Notice: Subject to any disclaimer, the term of this patent is extended or adjusted under 35 U.S.C. 154(b) by 101 days.

(21) Appl. No.: 11/516,247

(22) Filed: Sep. 6, 2006

(65) Prior Publication Data

US 2007/0058685 A1 Mar. 15, 2007

Related U.S. Application Data

(63) Continuation-in-part of application No. 11/104,139, filed on Apr. 12, 2005.

(51) Int. Cl.
*H01S 5/00* (2006.01)
(52) U.S. Cl. ..................... 372/50.22; 372/32
(58) Field of Classification Search .............. 372/32, 372/50.22
See application file for complete search history.

(56) References Cited

U.S. PATENT DOCUMENTS

| | | | |
|---|---|---|---|
| 4,792,962 A | 12/1988 | Miyauchi et al. | |
| 4,956,844 A | 9/1990 | Goodhue et al. | |
| 5,069,545 A | 12/1991 | Hinz | |
| 5,103,456 A * | 4/1992 | Scifres et al. | 372/50.22 |
| 5,228,103 A | 7/1993 | Chen et al. | |
| 5,231,642 A | 7/1993 | Scifres et al. | |
| 5,870,417 A | 2/1999 | Verdiell et al. | |
| 6,212,215 B1 * | 4/2001 | Payne et al. | 372/68 |
| 6,917,729 B2 | 7/2005 | Zediker et al. | |
| 2001/0030985 A1 | 10/2001 | Abeles | |
| 2002/0176151 A1 | 11/2002 | Moon et al. | |
| 2004/0141540 A1 | 7/2004 | Masood et al. | |
| 2005/0008294 A1 | 1/2005 | Park et al. | |
| 2005/0063429 A1 | 3/2005 | Ahmadvand | |

OTHER PUBLICATIONS

Andreas et al. "Modification of the refractive index of lithium niobate crystals by transmission of high-energy 4He2+ and D+ particles", Appl. Phys. Lett., vol. 84, No. 19, (2004), pp. 3813-3815.
Wilson et al. "Narrow-linewidth master-oscillator power amplifier based on a semiconductor tapered amplifier", Applied Optics, vol. 37, No. 21, (1998) pp. 4871-4875.

* cited by examiner

*Primary Examiner*—Minsun Oh Harvey
*Assistant Examiner*—Patrick Stafford
(74) *Attorney, Agent, or Firm*—Darby & Darby PC

(57) ABSTRACT

A waveguide to waveguide coupled hybrid master oscillator power amplifier (MOPA) includes a wavelength locked laser master oscillator (MO) first chip including a semiconductor substrate, a waveguide region having a gain section, one side of the MO including an integrated wavelength selective feedback element and the other side of the MO including an integrated reflective or coupling element on one side the waveguide and an emitting surface opposite the integrated reflective or coupling element for emitting light. A power amplifier (PA) second chip is stacked above or below the MO. The PA includes a semiconductor substrate including a waveguide region having a gain section, an integrated reflective or coupling element on a side of the PA aligned with light emitted from the emitting surface of the MO and a coupling grating or turning mirror and integrated lens on an opposite side of the PA for emitting an output beam.

12 Claims, 13 Drawing Sheets

HYBRID MOPA HAVING NARROWBAND OSCILLATOR AND AMPLIFIER WITH INTEGRATED OPTICAL COUPLING

CROSS-REFERENCE TO RELATED APPLICATIONS

The present application is a continuation-in-part and claims the benefit of application Ser. No. 11/104,139 entitled "WAVELENGTH LOCKED LASER INCLUDING INTEGRATED WAVELENGTH SELECTING TOTAL INTERNAL REFLECTION (TIR) STRUCTURE" filed on Apr. 12, 2005.

STATEMENT REGARDING FEDERALLY SPONSORED RESEARCH OR DEVELOPMENT

Not applicable.

FIELD OF THE INVENTION

The invention relates to wavelength locked master oscillator power amplifiers (MOPAs), more particular integrated-circuit based wavelength locked hybrid MOPAs.

BACKGROUND AND PRIOR ART

High-power, single-mode laser diode sources are employed in a wide variety of applications. Exemplary applications include optical pumping of fiber amplifiers and solid state lasers, non-linear optical wavelength conversion and optical printing.

A variety of laser diode structures are known. Salient features of any given laser diode structure include: high output power, single near-Gaussian spatial mode, short- and long-term lasing mode stability over time, long-term reliability, compact packaging, manufacturability, and ease of coupling to an external waveguide such as an optical fiber. However, no single laser diode structure known possesses all of the above-described features.

Obtaining relatively high output power with single-mode emission by a laser diode is difficult. Structures having greater output power tend to produce either (a) multi-mode emission or (b) low long-term stability and reliability problems.

Some high-power, semiconductor laser diodes utilize a device structure referred to as a master oscillator power amplifier (MOPA). The MOPA light source referred to as a "master oscillator" or "injection laser" is optically coupled to a high-gain optical amplifier. MOPA lasers can be used to increase the output power of single mode lasers while maintaining a narrow linewidth. MOPAs use a structure having an oscillator section which produces a very narrow spectral output, and an integrated power amplifier section that increases the output power of the overall device without significantly affecting the spectral width. In some cases, the master oscillator and a high-gain optical amplifier are formed onto a common semiconductor substrate. However, for very high power applications, the master oscillator is formed on a first chip and the high-gain optical amplifier is formed on another chip. Such a MOPA, usually referred to as "Hybrid MOPA", allows the MO and PA to be separately optimized unlike monolithic MOPAs.

One common problem with the two-chip MOPA arrangement based on conventional edge-emitting diodes is the coupling of light from the master oscillator to the high gain amplifier, which typically requires precise alignment on the order of several microns which may not be obtainable using conventional assembly processes. Thus, in this hybrid multi-chip embodiment coupling of light from the master oscillator to the high gain amplifier generally limits the obtainable performance of the MOPA. What is needed is a manufacturable hybrid MOPA coupling arrangement that facilitates assembly thereof to provide enhanced optical coupling between the master oscillator and high-gain optical amplifier.

SUMMARY OF THE INVENTION

A waveguide to waveguide coupled hybrid master oscillator power amplifier (MOPA) comprises a wavelength locked laser master oscillator (MO) first chip including a semiconductor substrate including a waveguide region having a gain section. One side of the MO includes an integrated wavelength selective feedback element, and the other side of the MO includes an integrated reflective (e.g. mirror) or coupling element (e.g. grating) on one side the waveguide and an emitting surface opposite the integrated reflective or coupling element for emitting light. A power amplifier (PA) second chip is stacked above or below the MO. The PA includes a semiconductor substrate including a waveguide region having a gain section, an integrated reflective or coupling element on a side of the PA aligned with light emitted from the emitting surface of the MO and a coupling grating or turning mirror and integrated lens on an opposite side of the PA for emitting an output beam.

In one embodiment, the MO can comprise a grating coupled surface emitting diode laser (GCSEL) while the PA can comprise a surface emitting tapered semiconductor optical amplifier. The integrated wavelength selective feedback element can comprise a dual grating reflector (DGR) or a Distributed Bragg Reflector (DBR). The gain sections can be pn junctions, p-i-n structures, quantum wells, quantum dots or other known gain structures.

For emitting, one or both the MO and PA can both utilize a turning mirror and lens on opposite sides of the respective waveguides. In another embodiment, for emitting, the MO and said PA can both utilize integrated grating couplers. In this embodiment, the respective gratings preferably have substantially equal periodicity, tooth shape or height and their respective planes are parallel to one another. As used herein, "substantially equal" regarding grating parameters refers to the parameters (e.g. periodicity, tooth shape or height) being within ±10%, and preferably within ±1% of one another.

In a preferred embodiment, separate electrical connections are provided for the MO and PA. In one embodiment, a plurality of MOPAs are provided having separate electrical connections for the respective MOs and PAs. The plurality of MOPAs can be angled to align respective output beams to provide an overlapping spot.

BRIEF DESCRIPTION OF FIGURES

There is shown in the drawings embodiments which are presently preferred, it being understood, however, that the invention can be embodied in other forms without departing from the spirit or essential attributes thereof.

FIG. 2(a) shows a cross sectional view of a surface emitting diode laser having a pair of gratings in the passive region adjacent to the gain section of the laser, according to an embodiment of the invention, while

FIG. 8(a) shows pulse energy and pulsewidth data obtained from a MOPA according to the invention operated using an ultrashort pumping condition vs. PA peak current, while

DESCRIPTION OF THE PREFERRED EMBODIMENT

A waveguide to waveguide coupled hybrid master oscillator power amplifier (MOPA), comprises a wavelength locked laser master oscillator (MO) first chip comprising a semiconductor substrate including a waveguide region having a gain section. One side of the MO includes an integrated wavelength selective feedback element and the other side of the MO includes an integrated reflective or integrated coupling element on one side the waveguide and an emitting surface opposite the integrated reflective or coupling element for emitting light. A power amplifier (PA) second chip is stacked above or below the MO. The PA includes a semiconductor substrate including a waveguide region having a gain section. An integrated reflective or coupling element on a side of the PA is aligned with light emitted from the emitting surface of the MO and a coupling grating or turning mirror and integrated lens is disposed on an opposite side of the PA for emitting an output beam.

Figure 1A:
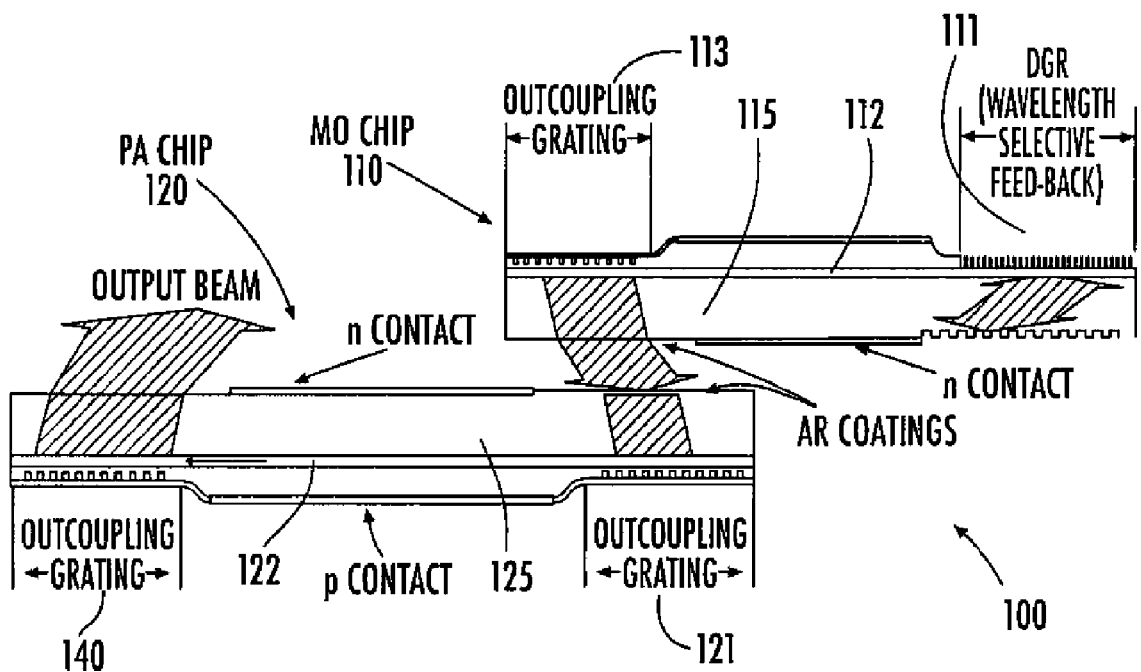
FIG. 1(a)-(d) shows side assembly schematic views for exemplary hybrid Master Oscillator Power Amplifier (MOPA) according to the invention which includes two optically coupled laser diode chips comprising a master oscillator (MO) and power amplifier (PA) stacked in the vertical direction. Light from the MO chip is coupled into the PA chip using respective coupling gratings on each of the chips. The periodicities of the gratings are the same and the planes of the respective chips are parallel to one another.

FIG. 1(a) shows a schematic view of an assembled hybrid Master Oscillator Power Amplifier (MOPA) 100 according to the invention which includes two optically coupled laser diode chips comprising a wavelength locked master oscillator (MO) 110 and power amplifier (PA) 120 stacked in the vertical direction. In a preferred application, such an arrangement provides a stable essentially single wavelength pulsed laser output at optimum pump current for MO 110 while allowing PA 120 to operate under a significantly higher pump current.

PA 120 is disposed on a first mount, while MO 110 is disposed on a submount, the submount being mounted on mount (not shown). MO 110 and PA 120 are optically coupled by structures integrated on the respective chips, such as integrated gratings (generally referred to herein as grating couplers or in some places outcoupling gratings) or integrated turning mirrors and lenses. In a preferred embodiment MO 110 and PA 120 are both broad area devices having large emitting areas with dimensions of at least about of $100 \times 100$ $\mu m^2$. The large emitting area translates to a significantly reduced fabrication and alignment tolerance of the vertically stacked chips compared with assembly of the conventional broad area edge-emitting diodes where emitting area is generally about of $1 \times 100$ $\mu m^2$.

The wavelength locked MO 110 includes substrate 115 having waveguide 112 therein preferably interposed between a integrated wavelength selective feedback element shown as a dual grating reflector (DGR) 111 on one side of the MO. DGR 111 provides wavelength selective feedback and thus permits MO 110 to lase at essentially single wavelength.

Grating coupler 113 comprises a grating structure etched into or disposed on the waveguide surface. The grating coupler 113 can utilize different shaped features (teeth), such as parallelogramic, trapezoidal, rectangular and triangular. Moreover, the feature heights (e.g. etch depth) can be varied to optimize coupling. The duty cycle can also be varied. Although not shown, the surface of grating coupler is generally coated with a highly reflecting (HR) layer.

Propagating light is progressively diffracted by grating coupler 113 and projects the light into the free space region below the waveguide surface toward PA 120 due to a high reflectivity (HR) coating on the topside of grating outcoupler 113. MO coupling grating 113 thus provides efficient transformation of the waveguided mode into a free-space propagation beam.

PA 120 is preferably a tapered semiconductor optical amplifier (SOA) for increasing output power. PA 120 is disposed on a second chip and is assembled below MO 110, but can be assembled above MO 110. Moreover, the invention is not limited to tapered amplifiers. PA 120 includes substrate 125 and waveguide 122. For example, the SOA active section could be shaped in other ways, for example, straight stripe, inverse bowtie. PA 120 operates in traveling-wave mode and the PA chip includes second integrated grating outcoupler 121. The grating outcoupler 121 integrated with PA 120 which makes an inverse transformation of the incident free-space propagation beam into a waveguide mode of the PA 120. A surface of PA 120 aligned with the light beam from MO 110 generally includes the AR coating shown to provide enhanced optical coupling between MO 110 and PA 120. On the other side of PA 120 is a coupling grating 140 having a HR coating thereon (not shown). On a side of the PA chip opposite coupling grating 140 the output beam is emitted (surface emission). Since the emission is from an integrated grating 140, the output beam is generally angled relative to a surface normal.

An exemplary MOPA assembly procedure is now described. The MOPA is preferably assembled on an heat sink on which the PA chip 120 is bonded p-side down and a 500 $\mu$m-thick spacer soldered close to the input coupler of the PA 120. In contrast, the MO chip 110 is preferably bonded p-side up on the spacer directing the device output down to the PA. Alignment of the MO output and the PA input can be performed using the Flip-Chip technique during bonding of the MO chip. The position and angle alignments of the MO chip performed by using the Flip-Chip technique have been found by the Inventors to provide a placement accuracy of about 20 μm and in-plane angle precision of ~0.5 degrees.

Assuming MO 110 and PA 120 utilize the same waveguide material, for most efficient coupling gratings 113 and 121 should have the same feature periodicity and their planes should be oriented parallel to one another. If the refractive indexes are not equal, boundary conditions for phase matching should be used to determine appropriate respective grating parameters. Thus, in a preferred embodiment a grating output surface emitting technology is used in the invention not only for fabrication surface-emitting device but for effective optical link between the MO and PA devices.

Figure 1B:
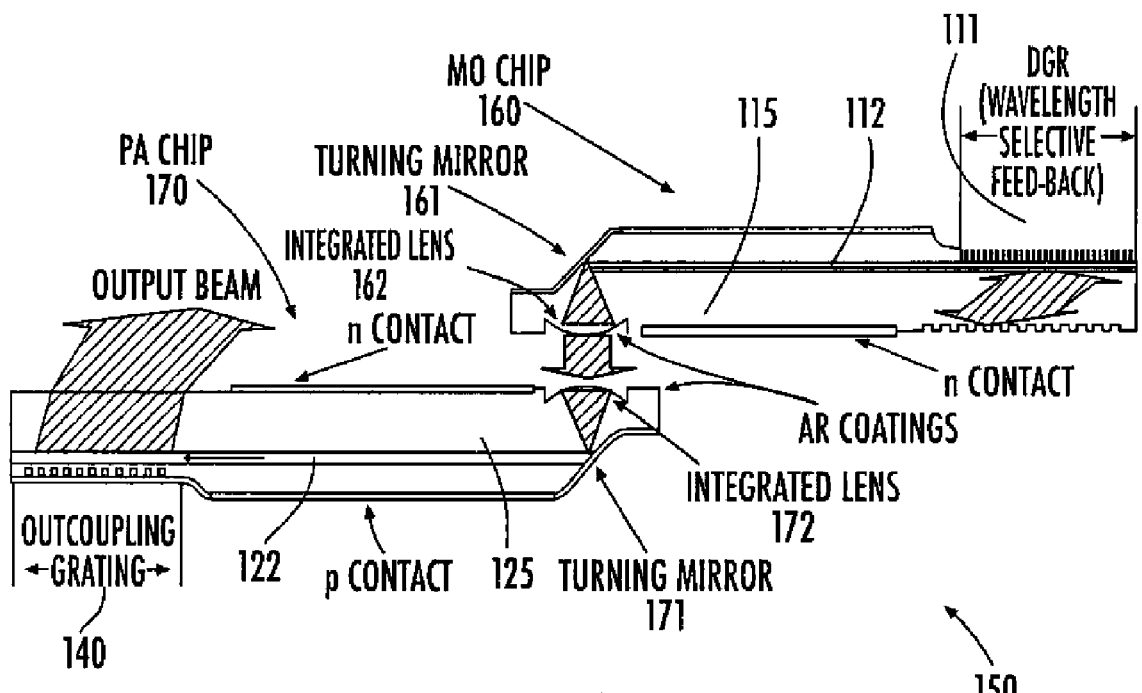

In another embodiment of the invention, lenses together with integrated turning mirrors are used to provide the integrated optical coupling between the MO and PA devices. A turning mirror is known to be a facet etched (typically wet chemical or plasma) that relies on total internal reflection to redirect an incident beam. FIG. 1(b) shows a side view of an assembly schematic for a hybrid MOPA 150 based on such an embodiment. MOPA 150 includes MO 160 and PA 170 having components common to MOPA 100 numbered the same. MO 160 includes integrated turning mirror 161 and integrated lens 162 having an AR coating thereon. Similarly, PA 170 includes integrated turning mirror 171 and integrated lens 172 having an AR coating thereon. AR coatings are provided on the lenses to reduce reflection from the high index contrast interface.

Figure 1C:
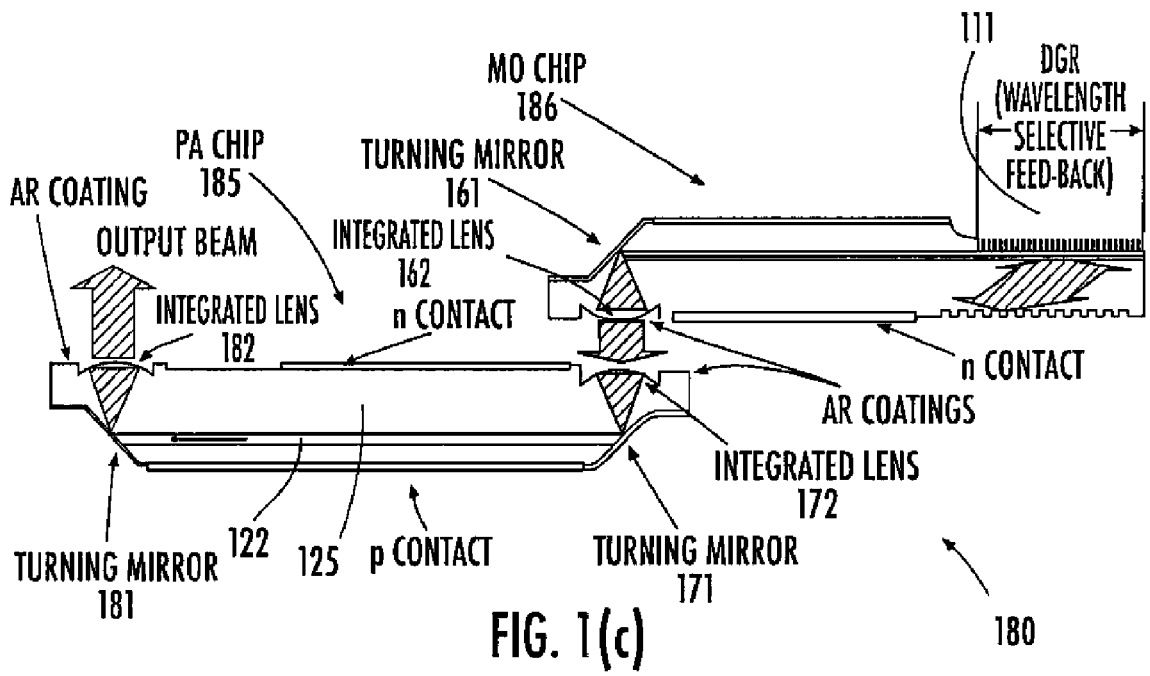
Figure 1D:
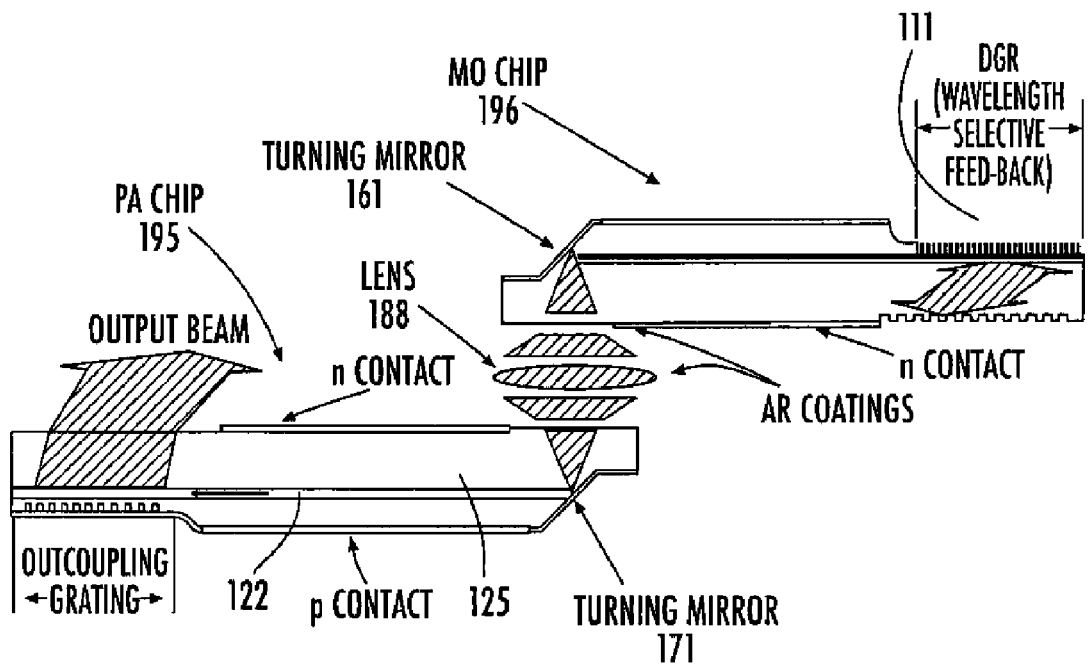

FIG. 1(c) shows a side view of an assembly schematic for a MOPA 180 comprising PA 185 and MO 186 based on MOPA 150 shown in FIG. 1(b), except coupling grating 140 is replaced by an integrated turning mirror 181 and integrated lens 182. The emission is shown to be perpendicular to the emission surface which is characteristic of turning mirror directed emissions. FIG. 1(d) shows a side view of an assembly schematic a MOPA 190 comprising PA 195 and MO 196 based on MOPA 150 shown in FIG. 1(b), except integrated lenses 171 and 172 are replaced by a lens 188 disposed in the air space between MO 196 and PA 195. Although not shown, lens 188 is generally secured using edge spacers. Lens 188 can be a GRIN lens.

Although the integrated wavelength selective feedback element shown in FIGS. 1(a)-(d) is a dual grating reflector 111, the invention is in no way limited to this embodiment. For example, dual grating reflector 111 can be replaced by a variety of integrated wavelength selective feedback elements including, but not limited to, a Distributed Bragg Reflector (DBR), as well as the structures shown in FIG. 2(b)-(k). DBRs are well known to be structures formed from multiple layers of alternating materials with varying refractive index, or by periodic variation of some characteristic (such as height) of a dielectric wave guide, resulting in periodic variation in the effective refractive index in the guide. Each layer boundary causes a partial reflection of an optical wave, and for waves with optical wavelength such that the many reflections combine with constructive interference, a high quality reflector is formed.

The MO is preferably operated in the gain- or Q-switching regime to produce a pulsed output beam, which in turn results in the PA emitting a pulsed output. Gain or Q-switching preferably utilizes electrical pulses for driving (or pumping) both MO and PA.

By utilizing internal wavelength locking and gain or Q-switching, MOPAs according to the invention can provide a narrowband high intensity pulsed output. The optical pulses generally range in pulse width from 20 picoseconds to several 100's of picoseconds.

Although no electric connections are shown in FIGS. 1(a)-(d), The MO and PA are electrically pumped. Separate drivers are preferably provided (not shown). Electrical pulses from the drivers are synchronized in time. Optical amplification results from process of stimulated emission while the light from MO is coupled into and then travels through the gain medium of the PA. An increase in output pulse energy occurs since the PA driving current has higher amplitude (e.g. 20-50 Amperes) and so higher electrical energy than for MO which generally operates at a much lower level (e.g. 2-5 Amperes).

The main difference in operating MOPAs according to the invention as compared to conventional direct pulse modulation is that driving pulses according to the invention should be shorter than a characteristics time, related to the carrier recombination processes in semiconducting gain media. Accordingly, for semiconducting diodes the electrical pulsewidth should be less than ~1 nsec. Laser diodes operated in gain- and Q-switching regimes exhibits sufficiently higher output peak power than in CW and QCW regimes. So both gain- and Q-switching result from high-speed pumping but they differ by processes taken place inside the laser. For the invention with devices having integrated wavelength locked (WL) and coupling gratings, dominant regime (either gain- or Q-) is strongly depending on device design parameters.

For example, in one embodiment a typical MO pump current pulse is <0.5 nsec at 2 to 5 amps, while the PA pump current pulse is 2 to 5 nsec at 20 to 50 amps. Regarding resulting optical parameters, pulse energy for MO in one embodiment is 2 to 4 nJ and 20 to 40 nJ for PA, while the pulsewidth for the output pulse from PA 160 is about 100 picoseconds.

As noted above, the pumping (or driving) should be fast enough to obtain a good gain- or Q-switching regime. Modern high-speed electronics usually have an electrical output with 50 ohm impedance, but laser diodes generally exhibit low input resistance, generally less than 1 ohm. Due to such large impedance mismatch, a direct connection between high-speed driver and laser diode results in, first, high reflection of the electrical power and, second, transformation (distortion) of the electrical pulse shape. Accordingly, an efficient way to resolve this matching problem is to provide a high-speed driver (e.g. an integrated circuit) which provides an output impedance that is well matched with the impedance of MO and PA. The high speed driver can be disposed on the respective MO and PA chips.

Figure 2A:
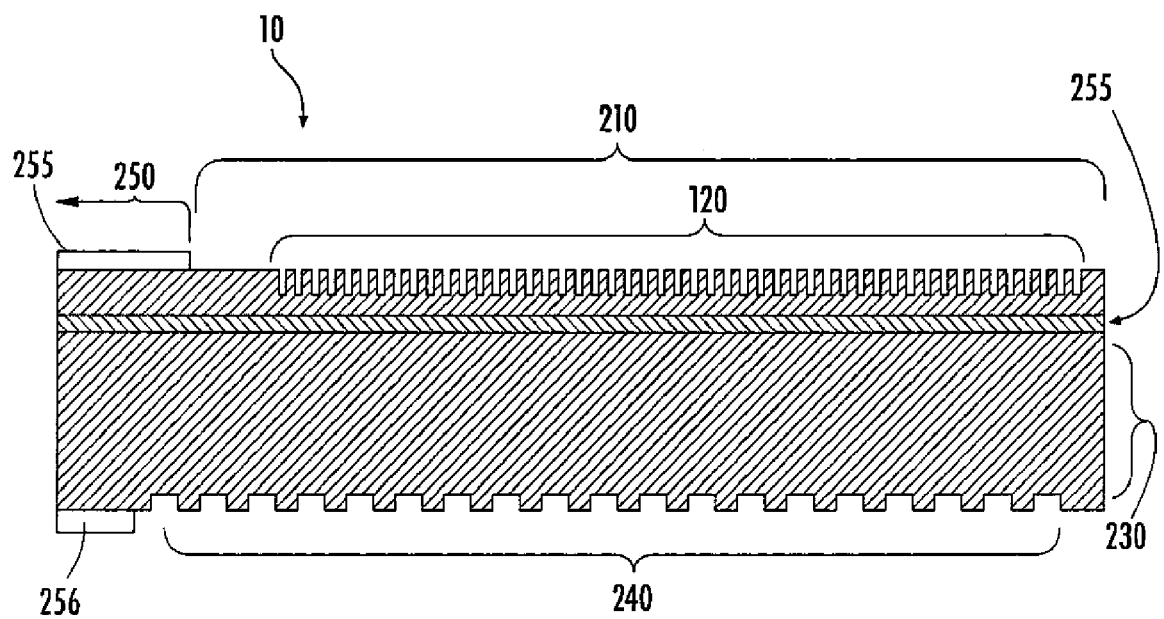

In a preferred embodiment of the invention, the MO is a surface emitting narrowband diode laser shown as laser 10 in FIG. 2(a). Laser 10 comprises a pair of integrated gratings in the passive region 210 adjacent to gain section 250 of waveguide 200. Gain section 250 includes gain media. Waveguide 200 is disposed on substrate 230, such as a starting epi substrate. Substrate 230 has a refractive index of $n_s$. Although the emitting region of laser 10 is not shown in FIG. 2, laser is surface emitting as shown in FIGS. 1(a)-(d).

A coupling grating 220 is shown disposed on waveguide 200. Coupling grating 220 has a grating period $d_{out}$. A second grating 240 is shown formed from or on substrate

230. Grating 240 has a plurality of features (e.g. teeth) having a grating period of $d_{littrow}$. Grating 240 has a grating period short enough to provide operation in the Littrow condition. Grating 240 is hereafter referred to as TIR grating 240. Although both gratings shown in FIG. 2(*a*) are disposed in passive region 210 of laser 10, one or more of the gratings or other reflective/transmissive structure can be disposed on gain section 250.

The dispersive resolution of a grating is known to allow the selection of a single lasing cavity mode at a time to be reflected back into the external cavity. The effect of the groove or other pattern of a grating on the direction of light diffracted by it is governed by the grating equation shown below:

$$m\lambda = nd(\sin \alpha + \sin \beta) \quad (1)$$

where α is the angle of incidence, β the angle of diffraction, λ and m the wavelength and diffraction order, n is the refractive index of the media in which the light is propagating, and d the spacing between adjacent grooves on the grating surface. As used herein, light includes light beyond the visible spectrum, including the ultraviolet and the infrared.

The Littrow configuration is that specific grating geometry in which the light of a specific wavelength diffracted from a grating, into a given diffraction order, travels back along the direction of the incident light: in Eq. (1) above, this requires:

$$\alpha = \beta \text{(the Littrow configuration)}. \quad (2)$$

With α=β the light gets coupled back into, not only the external cavity, but into the lasing cavity as well for feedback. For the Littrow configuration, the grating equation simplifies to:

$$m\lambda = 2dn \sin \alpha \quad (3)$$

"α" in the grating equation is generally referred to as the Littrow angle. Consequently, the wavelength diffracted into the laser is a function of, such that the dispersion plane remains perpendicular to the surface of the grating. Although the grating operated in the Littrow condition is capable of dispersing the incident light into a various number of diffraction orders, it is apparent to those having ordinary skill in the art that that the gain profile of the laser is narrow enough such that there is no second order light produced by the laser, since second order wavelengths would have values of $\lambda_1/2$. The same is true for subsequent orders, where $\lambda_m = \lambda_1/m$. Thus, the grating equation for the Littrow condition can be further simplified to: $\lambda = 2d \sin\alpha_L$, where m=1 only, and the first order diffracted wavelengths are sent back into the laser essentially exclusively.

The substrate 230 can be various semiconducting substrates such as Si, GaAS, InP, or GaN, or some insulating substrates. The material defining the laser waveguide and gain sections are preferably grown thereon. The starting substrate can be a laser epi wafer.

Gain region 250 of laser 10 can include a p-n junction. In this embodiment, laser 10 can be a grating-coupled surface-emitting laser (GCSEL). However, gain region 250 can also include a variety of other active layers, including a variety of solid amplifying medium. The gain region 250 may comprise a large optical cavity p-n junction, a single quantum well, multiple quantum wells, or quantum dots.

Contact layers to the p-side 255 and the n-side 256 which provide low resistance contacts for laser driver module (not shown) to drive device 10 are shown covering the gain region 250 in FIG. 2(*a*). Laser 10 will generally be electrically pumped.

Waveguide section 200 has an effective refractive index of $n_{eff}$, which is higher than the adjacent cladding regions. Based on first order equations of diffraction gratings, light (with a wavelength of λ) propagating in the waveguide section 200 in the passive region 210 of laser 10 which is incident on the out-coupling grating 220 which has a period $d_{out}$ will be diffracted at an angle of $\theta_1$ inside the substrate 230, according to:

$$n_s \sin\theta_1 + n_{eff} = \frac{n\lambda}{d_{out}}. \quad \text{Equation 4}$$

Given that $d_{out}$ is of the proper dimension and the refractive index of the material covering the grating $n_c$ is low enough m=1 will be the only diffracted order given that the following inequality:

$$d_{out} < \frac{\lambda}{n_c + n_{eff}} \quad \text{Equation 5}$$

is met.

The light diffracted from the out-coupling grating 220 will then be incident upon TIR grating 240, which has a period of $d_{littrow}$. Again from first order equation for diffraction gratings, the light diffracted by TIR grating 240 will be at an angle of $\theta_2$ according to:

$$n_s \sin\theta_1 + n_s \sin\theta_2 = \frac{in\lambda}{d_{littrow}}. \quad \text{Equation 6}$$

Given that $d_{littrow}$ is of the proper dimension as described below and the refractive index of the material covering grating 240 $n_c$ is low enough, m=0 and m=1 will be the only diffracted orders given that the following inequality:

$$d_{littrow} < \frac{\lambda}{n_s \sin\theta_1 + n_c} \quad \text{Equation 7}$$

is met. For the correct wavelength, $\lambda_{lock}$, the Littrow condition will be met and Eq. 6 will reduce to:

$$2n_s \sin\theta_1 = \frac{\lambda_{lock}}{d_{lithrow}}. \quad \text{Equation 8}$$

At $\lambda_{lock}$, light will be retroreflected by TIR grating 240. If the TIR grating 240 is of the correct depth, the diffraction efficiency into the m=0 order for the wavelength $\lambda_{lock}$ will be near zero. The m=1 retroreflected light will couple back into coupling grating 220 and propagate back into the gain region 250 of the device 10. Combining Equations 4 and 8, the wavelength $\lambda_{lock}$ at which the double grating configuration provide by gratings 220 and 240 will provide feedback to the gain region 250 of the semiconductor device 10 given by:

$$\lambda_{lock} = \frac{2d_{out}d_{littrow}}{2d_{littrow} - d_{out}} n_{eff},\qquad \text{Equation 9}$$

The resulting $\lambda_{lock}$ provided by the double grating configuration of device 10 is quite narrow, such as 0.12 nm, or less, as described in the Examples below from actual devices fabricated. As noted above and in examples provided below, out-coupling perturbation can be replaced by a mirror, such as a MEMS turning mirror, while TIR grating can be replaced by alternate structures including integrated prisms for providing feedback described below. Such alternate arrangements are also expected to provide narrow wavelength locks.

Figure 2B:
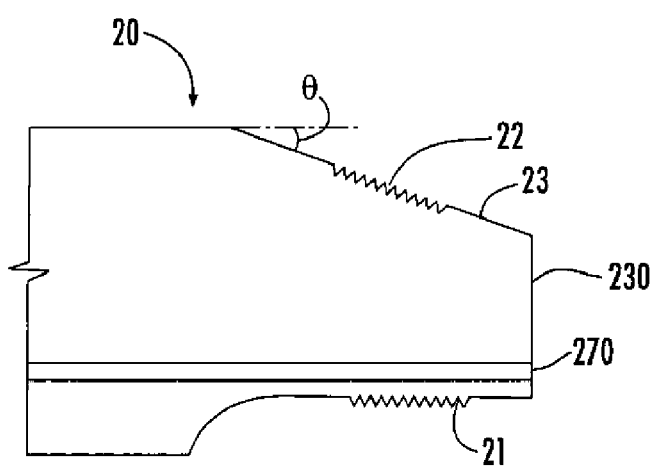
FIGS. 2(b)-(k) show some exemplary alternate embodiments of integrated light emitting semiconductor devices having integrated feedback for wavelength locking according to the invention.

FIGS. 2(b)-(k) shows some exemplary alternate embodiments of integrated light emitting semiconductor devices having integrated feedback for wavelength locking according to the invention. FIG. 2(b) shows surface emitting device 20 having a pair of integrated gratings. An out coupling grating 21 is disposed adjacent to waveguide/gain media 270. On the other side of starting substrate 230, a TIR grating 22 is disposed. The TIR grating 22 provides feedback and can be partially transmissive. Having a partially transmissive TIR grating 22 can maintain a high quality resonator while also emitting light, provide coupling grating 21 disposed on the opposing end of the resonator is highly reflective. TIR Grating 22 can be made partially transmissive through design of one or more parameters including period, depth, and duty cycle so that TIR grating 22 does not strictly operate under TIR conditions. The out-coupling grating 21 may also need to be modified to provide partially transmissive operation. EM modeling may be used to find appropriate grating parameters to achieve partially transmissive grating operation. In one embodiment, transmitted light from TIR grating 22 embodied as a partially transmissive grating can be used as an output for a temperature control circuit (not shown) to further control lasing wavelength stability of devices according to the invention.

The TIR grating 22 is shown in FIG. 2(b) is formed on a tilted surface 23 of substrate 230, with the tilted surface 23 being at an angle of θ with respect to un-etched surface of substrate 230. Changing θ changes the locking wavelength of device 20. The configuration shown in FIG. 2(b) can be used to create a partially transmitted configuration described above without changing out-coupling grating 21.

Figure 2C:
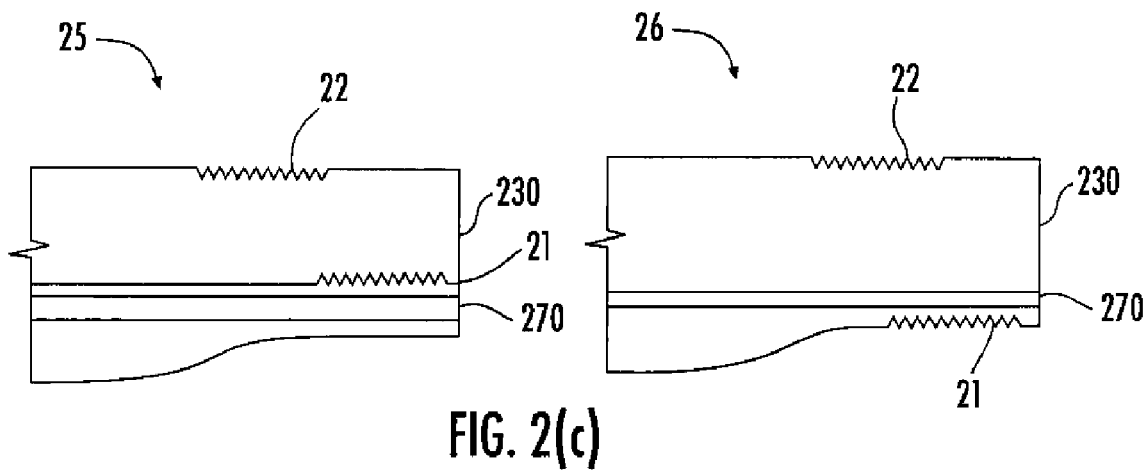
Figure 2D:
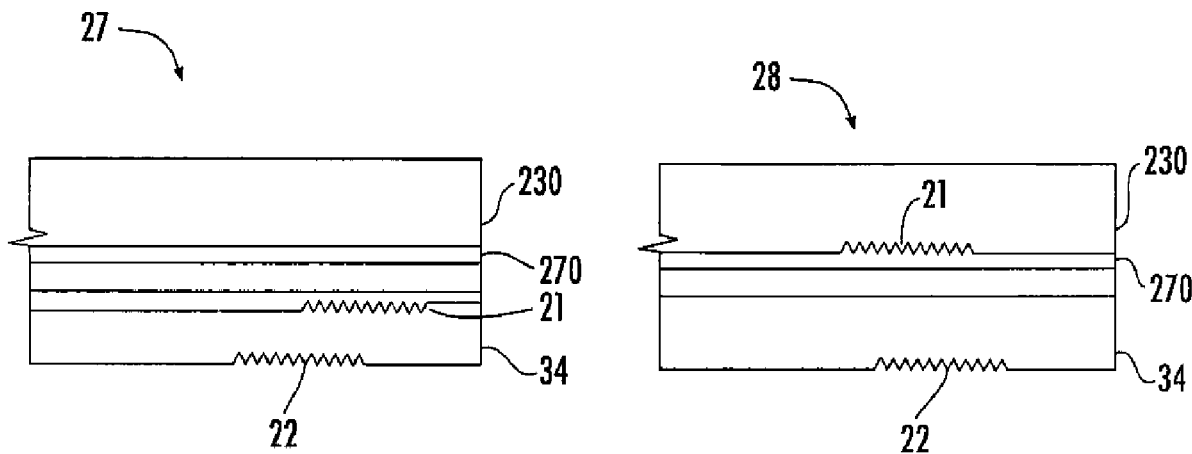

FIG. 2(c) shows surface emitting devices 25 and 26 having a pair of integrated gratings comprising TIR grating 22 and out-coupling grating 21. FIG. 2(d) shows surface emitting device 27 and 28 having a pair of integrated gratings comprising TIR grating 22 and out-coupling grating 21, where the TIR grating 22 is formed on epitaxial layer 34, rather than on substrate 230.

Figure 2E:
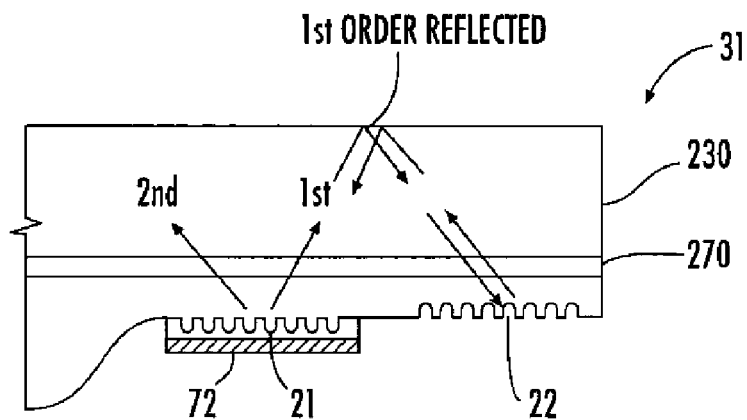

FIG. 2(e) shows surface emitting device 31 having a pair of integrated gratings comprising TIR grating 22 and coupling grating 21. Coupling grating 21 is shown having an optional highly reflective coating 72 thereon. As shown in FIG. 2(e), the respective gratings are configured and optically aligned so that only m=1 light becomes amplified. Coupling grating 21 functions as a dispersive element steering away m=2 light, for example, as shown.

Figure 2F:
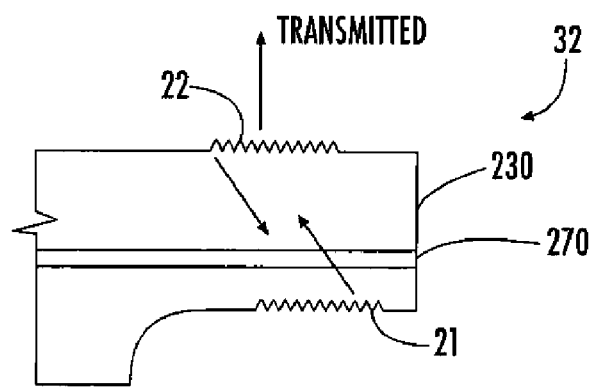

FIG. 2(f) shows surface emitting device 32 having a pair of integrated gratings comprising TIR grating 22 and coupling grating 21. TIR grating 22 is optionally configured as shown to be partially transmissive to permit some light to be transmitted therethrough. The out-coupling grating 21 can also emit some light, while the remainder can be coupled back into the resonator. Depending on the function desired, coupling grating 21 can provide light output for device 32, where part of the light is transmitted into the air. If a highly reflective out-coupling grating 21 is desired, although not shown in FIG. 2(f), a high-reflective coating layer, analogous to high-reflective coating layer 72 shown in FIG. 2(e) can be used.

Figure 2G:
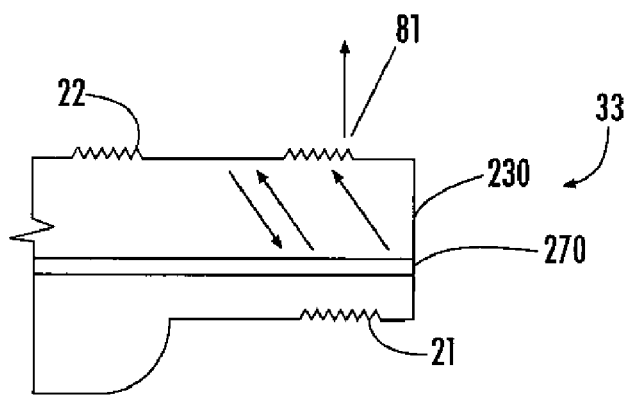

FIG. 2(g) shows surface emitting device 33 having a pair of integrated gratings comprising TIR grating 22 and out-coupling grating 21, together with a second TIR grating, TIR grating 81. In this configuration, TIR grating 22 retroreflects without any significant transmission, while TIR grating 81 is substantially transmissive. Using different grating parameters (e.g. etch depth, duty cycle, period), TIR gratings 22 and 81 can provide different wavelength selectivities.

Figure 2H:
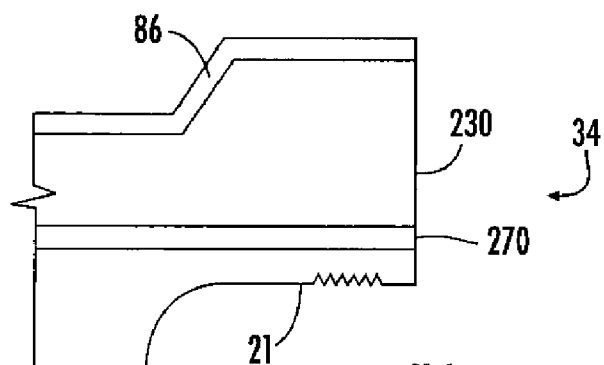

FIG. 2(h) shows surface emitting device 34 having a tilted plane for providing feedback 86 and a coupling grating 21. An optional highly reflective coating on tilted plane 86 can provide a substantially reflective response, while titled plane 86 is substantially transmissive without a highly reflective coating.

Figure 2I:
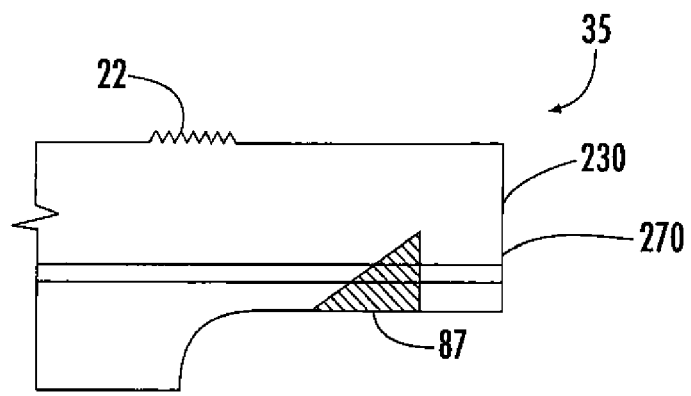

FIG. 2(i) shows surface emitting device 35 having TIR grating 22 and an implanted perturbation 87 which functions as an out-coupling. Implanted perturbation 87 extends through waveguide/gain media 270 into starting substrate 230. Ion implantation can be used to introduce a localized change in the index of refraction to form a dielectric perturbation. (See Andreas et al. entitled "Modification of the refractive index of lithium niobate crystals by transmission of high-energy $^4He_2^+$ and $D^+$ particles, Appl. Phys. Lett., Vol. 84, No. 19, 10 May 2004, 3813-3815).

Figure 2J:
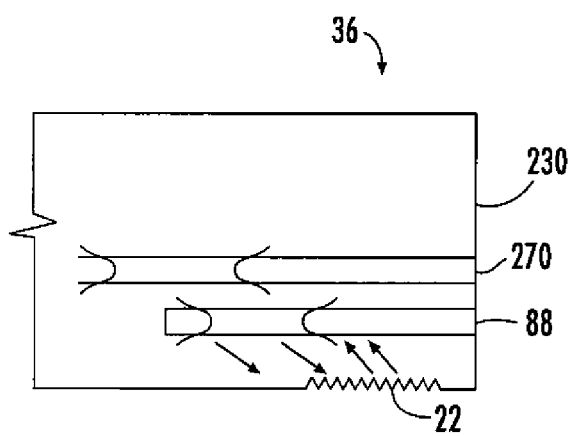

FIG. 2(j) shows surface emitting device 36 having TIR grating 22 and a leaky mode waveguide 88 to function as an out-coupling. Published U.S. Application No. 20050008294 to Park which provides a description of leaky mode waveguides is incorporated by reference into the present application for its disclosure regarding leaky mode waveguides. Light from TIR grating 22 is transferred to the leaky mode waveguide 88 which couples back to the waveguide/gain media 270. The Gaussian-like traces shown in leaky mode waveguide 88 and waveguide/gain media 270 represent light coupling from waveguide 88 to waveguide/gain media 270.

Figure 2K:
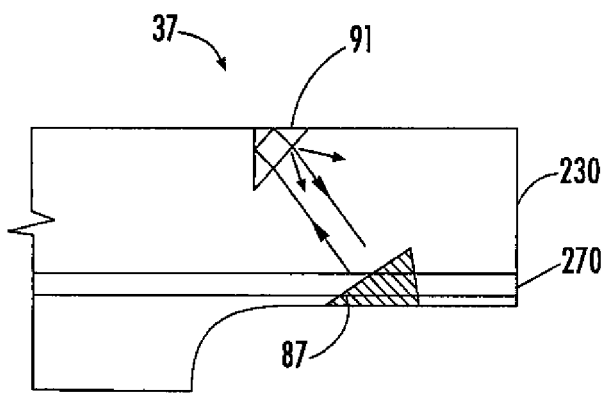

FIG. 2(k) shows surface emitting device 37 having an integrated prism 91 for feedback and an implanted perturbation 87 to function as an out-coupling. Integrated prism can be formed using ion implantation to form a graded index and/or variable index of refraction for transforming the incident light as noted above.

Figure 3:
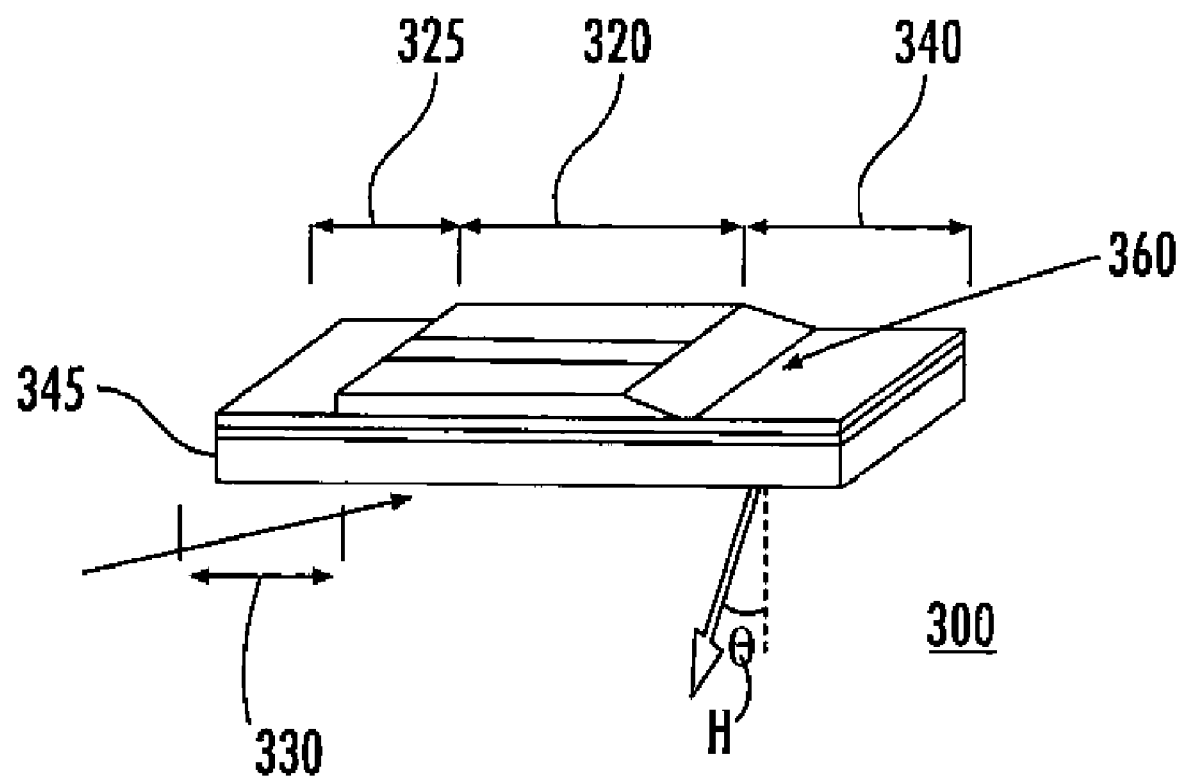
FIG. 3 shows a cross sectional view of a grating-coupled surface-emitting laser (GCSEL) having a pair of gratings in the passive region adjacent to the gain section of the laser which in a preferred embodiment is used as the MO for MOPAs according to the invention.

FIG. 3 shows a schematic of an exemplary semiconductor grating coupled surface emitting diode laser (GCSEL) 300 suitable for use as a MO according to the invention that was device was designed, fabricated, and tested. GCSEL 300 was fabricated using a GaAs epi laser substrate 345 having an estimated waveguide effective refractive index of 3.23. On one side of the gain section 320 of the device in the passive region a short-periodicity out-coupling grating 325 was fabricated on the p-side of device 300 while a TIR grating 330 was built on the n-side. The epi substrate 545 provided a typical broad gain region extending from approximately 965 run to 985 nm, with a peak gain near 975 nm.

The period of the out-coupling grating 325 was 220 nm. A second out coupling grating 340 was disposed in the passive region on p-side on the side of the gain section 320 opposite to the out-coupling grating 325 and TIR grating 330 to allow for higher optical power from the device 300. Out-coupling grating 340 had a grating period of 270 nm and was covered by a highly reflective coating 360 comprising a 130 nm layer of SiNH followed by a layer of 250 nm layer of Au.

Devices using two different periods for the TIR grating 330 were tested, 400 nm and 410 nm. GCSEL 300 formed using a 400 nm period TIR grating 330 provided a calculated locking wavelength of 980 nm, while for the 410 nm periodicity of TIR grating 330, the calculated locking wavelength was 971 nm.

Figure 4:
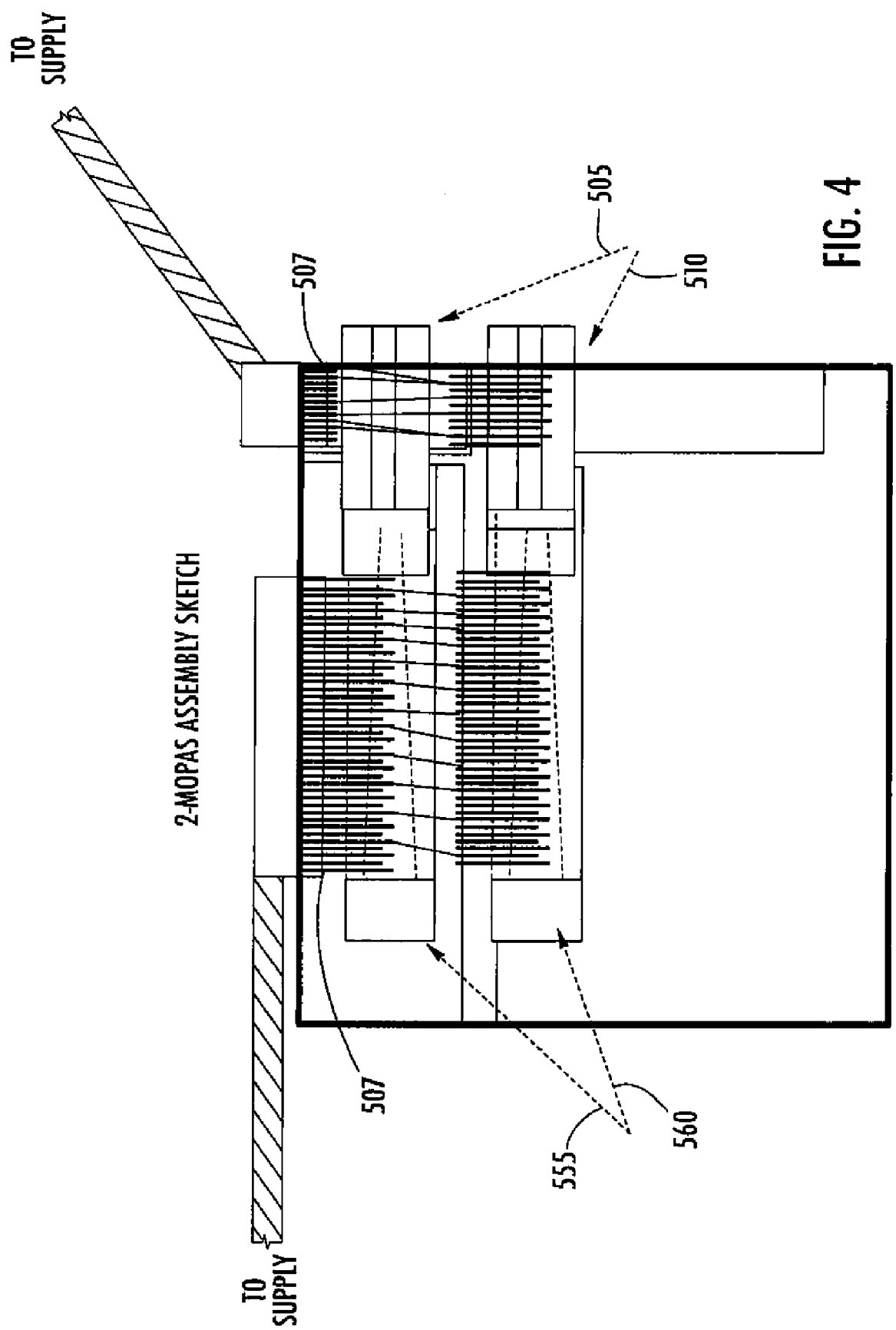
FIG. 4 shows a two MOPA design according to the invention which provides increased total output power. In this case electrical connections for the MO and PA chips are in series. For further increasing power, linear arrays of the MO and PA can be used.

FIG. 4 shows a two MOPA design 500 according to the invention which provides an increased total output power as compared to a single MOPA. In this case the electrical connection 507 to the MO chips 505 and 510 as well as the electrical connection 507 to the PA chips 555 and 560 are in series. For further increasing power, linear arrays MOs and PAs can be used.

Figure 5:
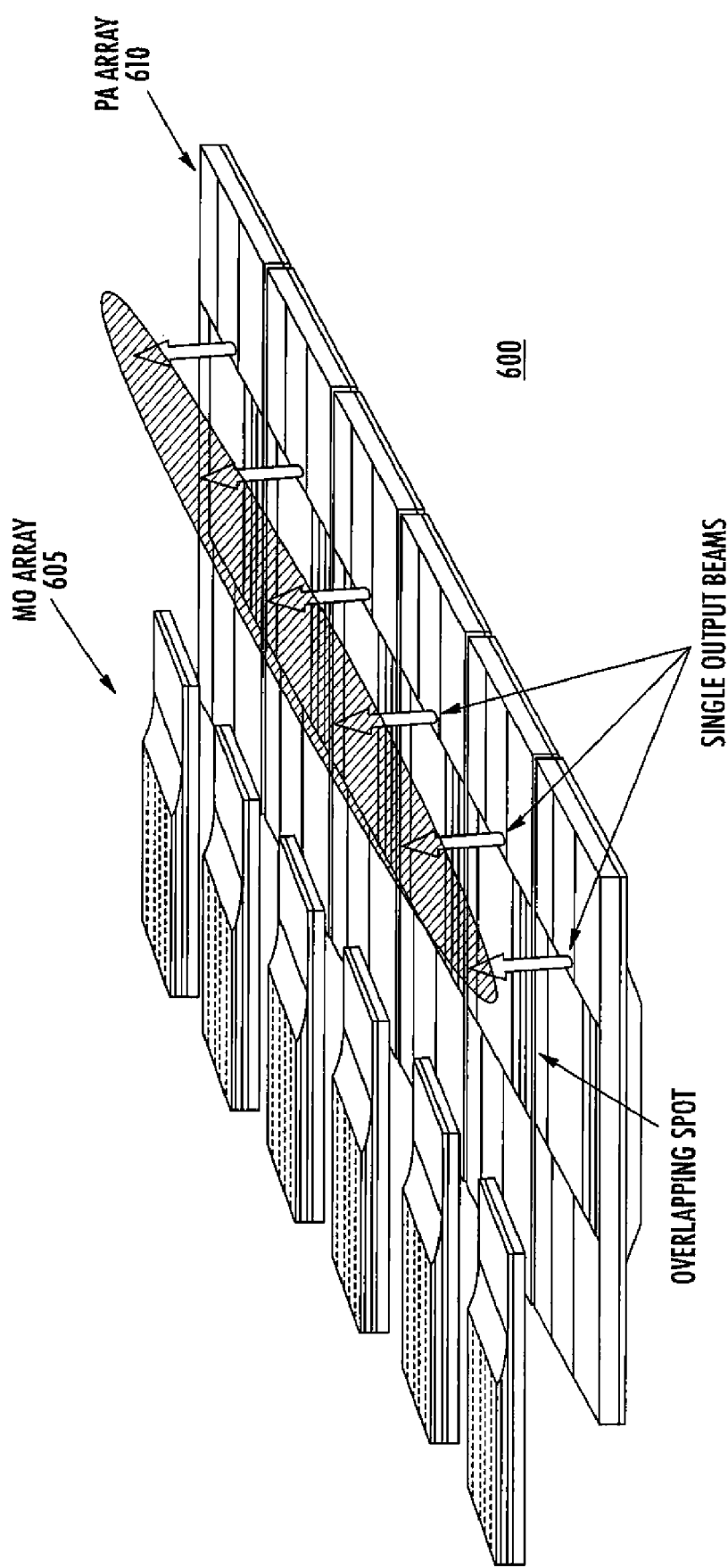
FIG. 5 shows a linear array of MOPAs. Electrical connection of the individual MO and PA chips is in parallel and thus requires a higher current than for serial connection shown in FIG. 4. Output beam from the linear MOPA array has elliptical shape which long lateral dimension is generally defined by periodicity and total number of the individual emitters in the array.

FIG. 5 shows a linear array of MOPAs 600 comprising a GCSEL MO array 605 and PA array 610. Each PA in PA array 610 has an associated MO from MO array 605. MOPA array 600 is fabricated on one submount. Electrical connection to the individual MO and PA chips are in parallel (not shown), thus requiring a higher pump current as compared to the serial connection shown in FIG. 4. The resulting output beam from the linear MOPA array 600 has elliptical shape which long lateral dimension is generally defined by periodicity and total number of the individual PA emitters in the array 600.

In one embodiment, regarding operation of MOPA array 600, it is expected that the MO pump current pulse will be <0.5 nsec is 30 to 60 amps, while the PA pump current pulse width will be 2 to 5 nsec at 200 to 1,000 amps. Regarding resulting optical parameters for array 600, the combined pulsed output from the 10 SOAs is expected to be 200 to 400 nJ, while the pulsewidth for the output pulse is expected to be about 100 picoseconds.

Figure 6A:
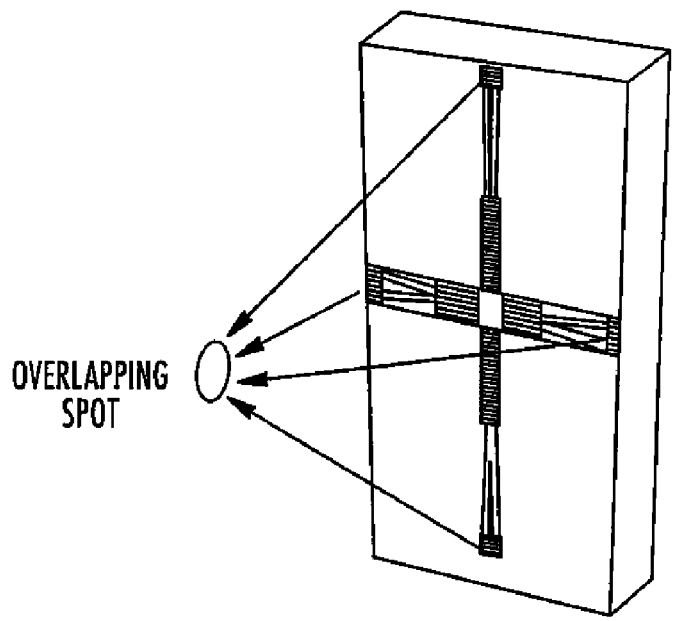
FIGS. 6(a) and (b) shows multiple MOPAs in a "Star" configuration. Since the output beams from individual MOPAs having integrated gratings for emission are angled, the arrangement shown provides a higher optical density on the plane of the overlapping spot.
Figure 6B:
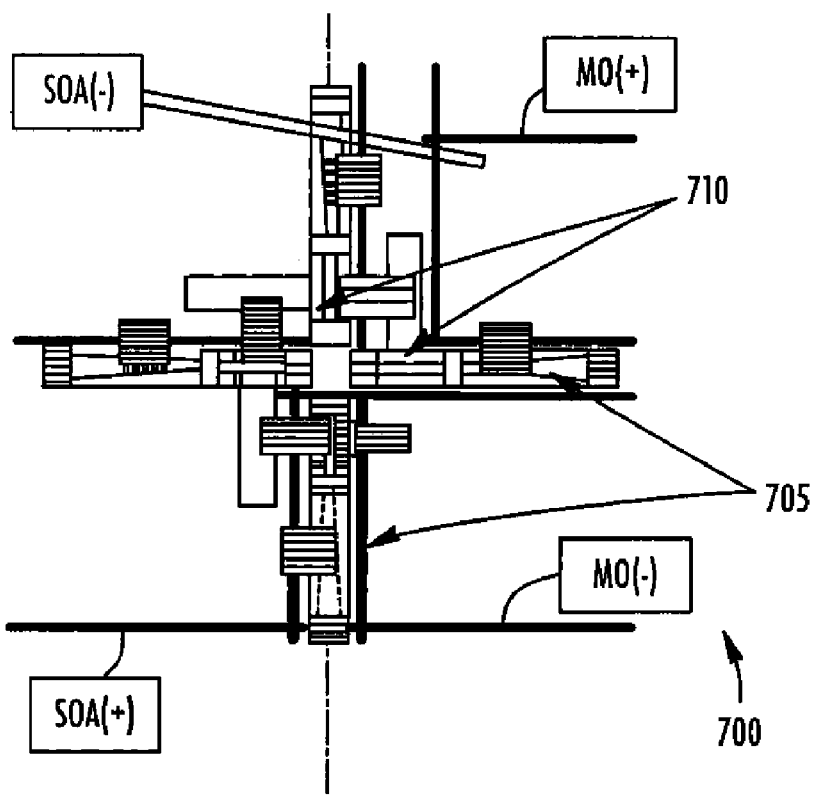

FIG. 6(*a*) shows an arrangement of four (4) MOPAs in a star MOPA configuration. PA chips 705 are associated with MO chips 710. Bias connections and electrical supply lines are shown for providing electrical connections to pump MO 710 and PA 705. The supply lines for MO are shown as MO(+) and MO(−), while the electrical supply lines for PA 705 are shown as SOA (+) and SOA (−). Supply lines for MO and PA are on different planes (lines for MO raised) and thus do not contact when overlapping.

Since the output angle of the emission is not normal to the PA surface when an grating outcoupler is used, and the beam divergence is low, a Star symmetric location of the identical MOPAs will result in overlapping spots from the respective PAs. Since output beams from individual MOPAs are angled, the assembly shown provides a higher optical density on the plane of the overlapping spot. Such an arrangement provides a high level of brightness to a desired target as shown by the overlapping spot shown in FIG. 6(*b*). The same arrangement can be used for light sources with orthogonal linear polarization.

Using an array of MOPAs which individually emit at slightly different wavelengths, allows application of wavelength combining technique to increase brightness through a combination of wavelength constellations. The concepts of wavelength division multiplexing (WDM) can be implemented by spectrally combining an array of wavelengths, where each array is in a star configuration. If a 50 nm bandwidth is obtained and a 0.12 nm spectral width (at 3 db bandwidth) is provided by each PA, the star array can operate at an energy of 50 nm/0.12 nm*20 to 40 njoules/star=8.3 to 16.6 μjoules. If polarization multiplexing is used, the energy can be doubled to 16.6 to 33.2 μjoules.

EXAMPLES

It should be understood that the Examples described below are provided for illustrative purposes only and do not in any way define the scope of the invention.

Experimental Results

Figure 7:
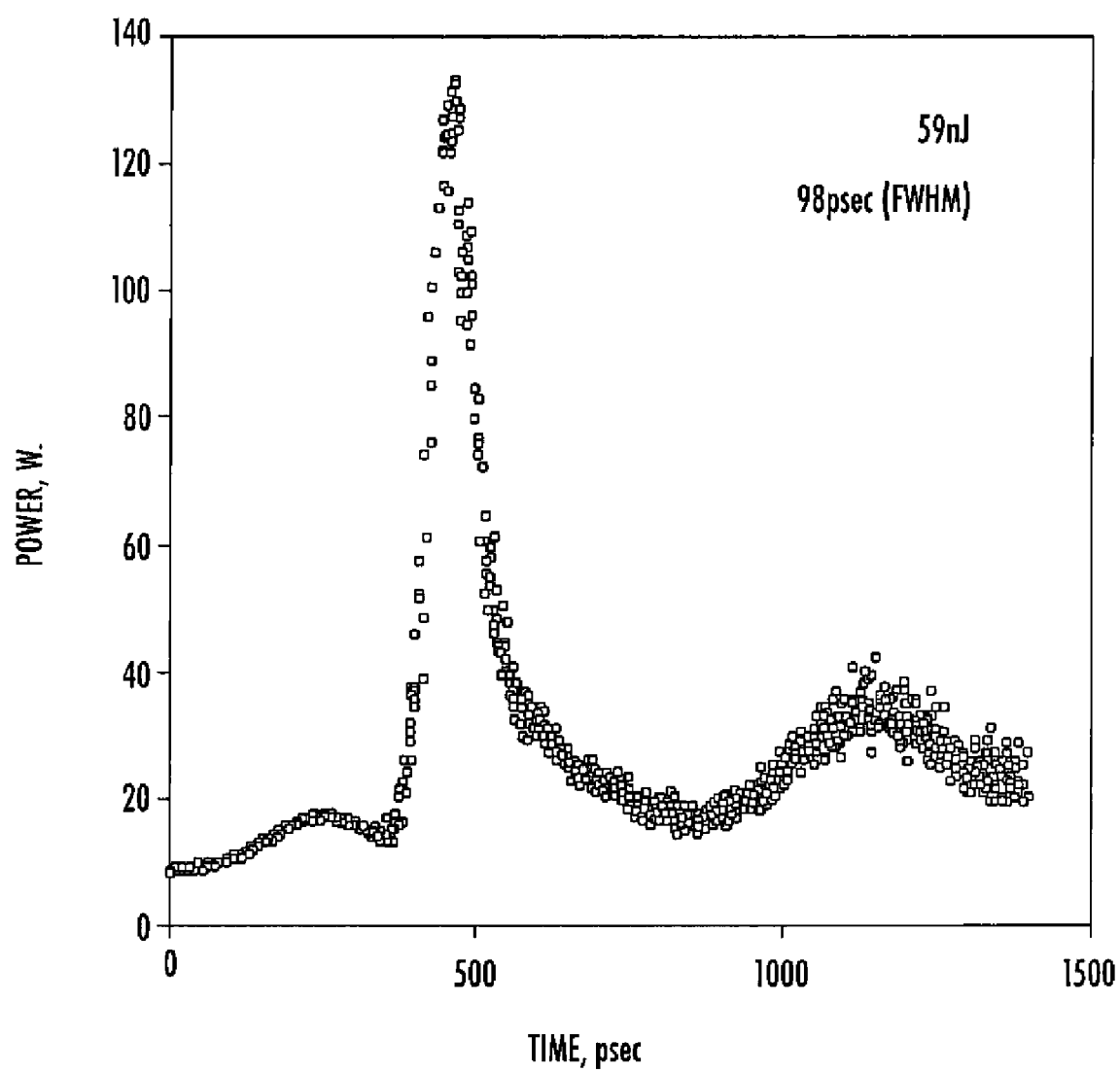
FIG. 7 shows the measured temporal profile of optical pulses obtained from a MOPA according to the invention measured using optimal pumping of the MO and PA with ultrashort current pulses.

Amplification of the gain-switching pulses from wavelength locked grating coupled device according to the invention were tested for the MOPA assembly based on coupling with integrated gratings based on MO 100 shown in FIG. 1(*a*). Both the MO 110 and PA 120 were driven by electrical pulses having durations that were less than 1 nanosecond. FIG. 7 presents a sample of the temporal pulse shaped emissions measured under optimal pumping of the MO and the PA. As shown in FIG. 7, optical pulses with a FWHM pulsewidth of 98 psec and a peak power of 130 W were obtained. The optical peak power was evaluated by integrating the recorded pulse temporal profile, yielding an estimated pulse energy of 59 nJ.

Figure 8A:
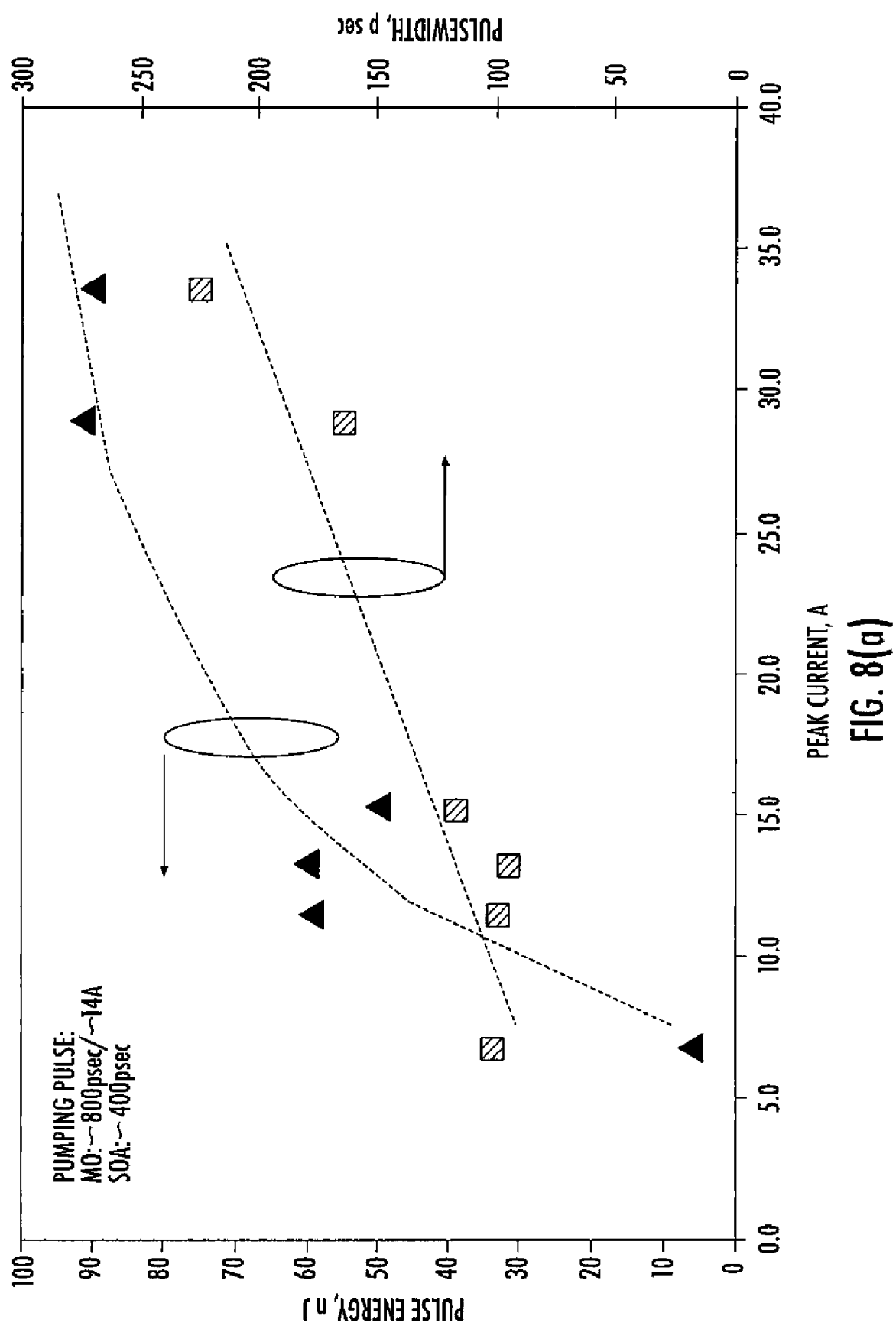
Figure 8B:
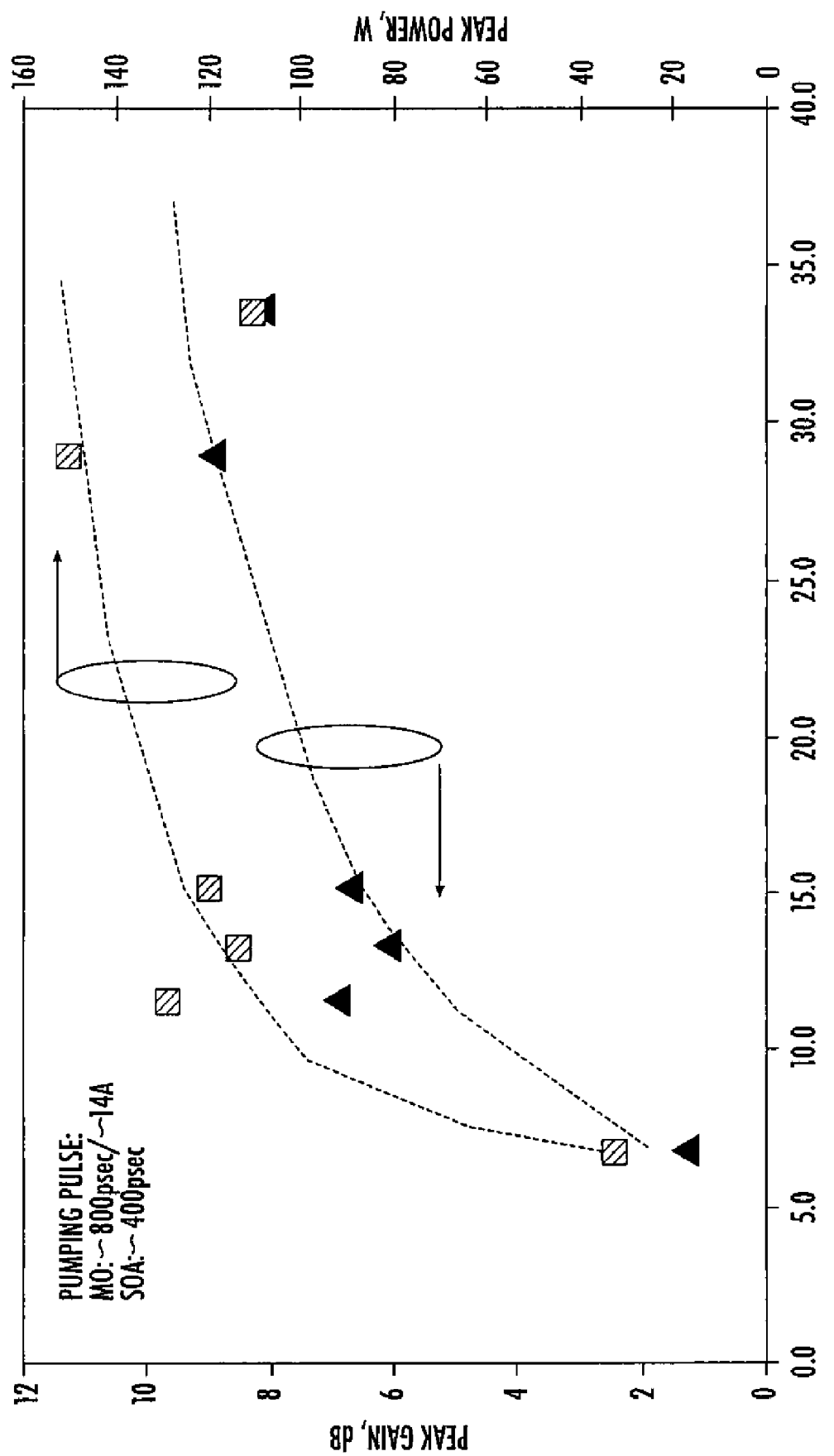
FIG. 8(b) shows peak gain and peak power as a function of PA peak current.

Optical pulse characteristics were obtained from the MOPA according to the invention operated in an ultrashort pumping condition (again, electrical pulses having durations that were less than 1 nanosecond). Pulse energy and pulsewidth are shown in FIG. 8(*a*) as a function of PA peak current, while FIG. 8(*b*) shows peak gain and peak power as a function of PA peak current. It is seen that in spite of increasing the total pulse energy with increasing the PA pumping, the peak power of the optical pulses became saturated due to optical pulse broadening. Comparative emission characteristics measured from the MOPA with different PA pumping are presented in Table 1 below.

TABLE 1

Compared characteristics of the MOPA which MO operated in gain-switching regime.

| Device description (active length/stripe width) | pulsewidth psec | Peak Power W | Pulse Energy nJ |
|---|---|---|---|
| MO: WL DGR/GCSEL (2 mm/200 um)/ PA: tapered DGCSE (4 mm/200 um-650 nm) | 98 195 | 130 160 | 59 92 |

This invention can be embodied in other forms without departing from the spirit or essential attributes thereof and, accordingly, reference should be had to the following claims rather than the foregoing specification as indicating the scope of the invention.

We claim:

1. A waveguide to waveguide coupled hybrid master oscillator power amplifier (MOPA), comprising:
   a wavelength locked laser master oscillator (MO) first chip comprising a semiconductor substrate including a waveguide region having a gain section, one side of said MO including an integrated wavelength selective feedback element and the other side of said MO including an integrated reflective or coupling element on one side said waveguide and an emitting surface opposite said integrated reflective or coupling element for emitting light;
   a power amplifier (PA) second chip stacked above or below said MO comprising a semiconductor substrate including a waveguide region having a gain section, said PA including an integrated reflective or coupling element on a side of said PA aligned with light emitted from said emitting surface and a coupling grating or turning mirror and integrated lens on an opposite side of said PA for emitting an output beam.

2. The MOPA of claim 1, wherein said integrated wavelength selective feedback element comprises a dual grating reflector (DGR).

3. The MOPA of claim 1, wherein said integrated wavelength selective feedback element comprises a Distributed Bragg Reflector (DBR).

4. The MOPA of claim 1, wherein said integrated reflective element of said MO and said PA both comprise a turning mirror and lens on opposite sides of said waveguides.

5. The MOPA of claim 1, wherein said integrated coupling element of said MO and said PA both comprise integrated grating couplers.

6. The MOPA of claim 5, wherein said integrated grating couplers have substantially equal periodicity, tooth shape or height and their respective planes are parallel to one another.

7. The MOPA of claim 1, wherein said gain sections are selected from the group consisting of pn junctions, p-i-n structures, quantum wells and quantum dots.

8. The MOPA of claim 1, wherein said MO comprises a grating coupled surface emitting diode laser.

9. The MOPA of claim 1, wherein said PA comprises a surface emitting tapered semiconductor optical amplifier.

10. The MOPA of claim 1, further comprising separate electrical connections for said MO and said PA.

11. The MOPA of claim 1, further comprising a plurality of said MOPAs hooked in series or parallel.

12. The MOPA of claim 11, wherein said plurality of MOPAs are angled to align respective output beams to provide an overlapping single spot.

* * * * *

UNITED STATES PATENT AND TRADEMARK OFFICE
CERTIFICATE OF CORRECTION

PATENT NO. : 7,388,894 B2  Page 1 of 1
APPLICATION NO. : 11/516247
DATED : June 17, 2008
INVENTOR(S) : Jason Kirk O'Daniel et al.

It is certified that error appears in the above-identified patent and that said Letters Patent is hereby corrected as shown below:

In the Front Cover:

Item (75) Inventors please delete "Eric Gordan Johnson" and insert --Eric Gordon Johnson--

Signed and Sealed this

Second Day of September, 2008

JON W. DUDAS
*Director of the United States Patent and Trademark Office*